United States Patent [19]
Sakamoto et al.

[11] 3,909,306
[45] Sept. 30, 1975

[54] MIS TYPE SEMICONDUCTOR DEVICE HAVING HIGH OPERATING VOLTAGE AND MANUFACTURING METHOD

[75] Inventors: Takashi Sakamoto, Kodaira; Nobuhiro Tsuji, Kunitachi; Hiroto Kawagoe, Kodaira, all of Japan

[73] Assignee: Hitachi, Ltd., Japan

[22] Filed: Feb. 7, 1974

[21] Appl. No.: 440,356

[30] Foreign Application Priority Data

Feb. 7, 1973 Japan ............................ 48-14670

[52] U.S. Cl. ................ 148/1.5; 148/187; 148/188; 148/175; 357/23; 357/91

[51] Int. Cl.[2] ........................................ H01L 21/265

[58] Field of Search ........... 148/1.5, 187, 188, 175; 357/23, 91

[56] References Cited

UNITED STATES PATENTS

| | | | |
|---|---|---|---|
| 3,404,450 | 10/1968 | Karcher | 148/175 X |
| 3,571,914 | 3/1971 | Lands et al. | 148/175 UX |
| 3,578,514 | 5/1971 | Lesk | 148/175 |
| 3,600,647 | 8/1971 | Gray | 357/23 X |
| 3,653,978 | 4/1972 | Robinson et al. | 148/1.5 |
| 3,663,872 | 5/1972 | Yanagawa | 148/175 X |
| 3,667,009 | 5/1972 | Rugg | 357/23 X |
| 3,685,140 | 8/1972 | Engeler | 148/188 X |

*Primary Examiner*—L. Dewayne Rutledge
*Assistant Examiner*—J. M. Davis
*Attorney, Agent, or Firm*—Craig & Antonelli

[57] ABSTRACT

A semiconductor device of metal-insulator-semiconductor construction and having a high operating voltage is formed of a semi-conductor substrate of one conductivity type which has a drain region of the opposite conductivity type and low impurity concentration formed in its major surface. The low impurity concentration region has formed therein a region of opposite conductivity type of a high impurity concentration. Simultaneously with the formation the high impurity concentration region, a source region of opposite conductivity type and high impurity concentration is formed in the substrate. An insulated gate electrode is formed to bridge the source region and the drain region of low impurity concentration, but to be spaced from the region of the high impurity concentration in the drain region, so that a depletion or space charge region extends deeply into the drain region.

11 Claims, 21 Drawing Figures

MIS TYPE SEMICONDUCTOR DEVICE HAVING HIGH OPERATING VOLTAGE AND MANUFACTURING METHOD

BACKGROUND OF THE INVENTION

1. Field of the Invention

The present invention relates to MIS semiconductor devices and a method of manufacturing MIS semiconductor devices. More particularly, it relates to a method of manufacturing MIS semiconductor devices which operate at a high power supply voltage.

3. Description of the Prior Art

Semiconductor devices, such as field-effect transistors and integrated circuits of metal-insulator semiconductors construction, namely, so-called MIS semiconductor devices, have hitherto been manufactured by various methods. However, the operating voltage characteritics of the prior art devices are not satisfactory.

In general, the process of manufacturing the MIS semiconductor may be explained as follows. For a P-channel device, an N-type substrate of silicon, for example, is employed. A P-type impurity is diffused into selected parts of the surface of the substrate to form a P-type source region and a P-type drain region. At the surface of the substrate between the source and drain regions, a gate electrode is formed on an insulating film.

In order to increase the operating voltage of the MIS semiconductor device, the source region and the drain region are $P^+$ high-concentration regions. That is, to improve the operating voltage characteristics of the MIS semiconductor device, no inversion layer should be formed at the surfaces of the source and drain regions.

By merely making the source and drain regions $P^+$ high-concentration regions, as described, however, it has been difficult to sufficiently increase the operating voltage.

The gate electrode generally extends over a part of the drain region. When a reverse bias voltage is applied to the P-N junction formed between the drain and the substrate, the gate electrode acts as an electrode for enhancing surface breakdown and, hence, the width of the depletion, or space charge layer from the P-N junction is small and limited at the drain junction surface beneath the gate electrode. The breakdown voltage is, therefore, lowered at the substrate surface, resulting in a lowering of the operating voltage limit of the semiconductor device.

It is consequently, considered that the operating voltage of the MIS semiconductor device may possibly be satisfactorily improved by letting the depletion layer extend sufficiently from the drain region into the substrate beneath the gate electrode.

Furthermore, even for D/MOS devices such as described in an article entitled "Double-diffused MOS Transistor Achieves Microwave Gain" by T. P. Cauge et al., Electronics, Feb. 15, 1971, esp. p. 103, having a relatively high impurity concentration surface drain layer diffused in an epitaxial relatively low concentration drain layer, because of the discontinuity of the P-N junction between the low concentration layer and the substrate, the electric field becomes concentrated at the point of the discontinuity and the breakdown voltage is lowered.

SUMMARY OF THE INVENTION

Accordingly, an object of this invention is to provide a MIS semiconductor device which has a simple structure and which has a high operating voltage and to provide a simple method of manufacturing the same.

According, to one embodiment of the present invention, the method of manufacturing a MIS semiconductor device includes forming an insulating film on the surface of a substrate of a first conductivity type, removing parts of the insulating film, and forming a source region and a drain region, and is characterized in that a region of a second conductivity type of comparatively low concentration is formed at that part of the substrate at which the drain region or the source region is to be formed, so that the P-N junction between the region and the substrate is not discontinuous in the substrate, a drain or source region of high-concentration is formed in a part of the region of low concentration, and a gate electrode is formed to cover the edge of the low concentration region, but spaced from the drain or source region.

DETAILED DESCRIPTION

Preferred Embodiments of the Invention

The preferred embodiments of the present invention will be described in detail hereunder with reference to the accompanying drawings.

Embodiment I

FIGS. 1*a* to 1*j* illustrate an embodiment in which the present invention is applied to an MOS type semiconductor device having a metallic gate of aluminum.

Figure 1A:
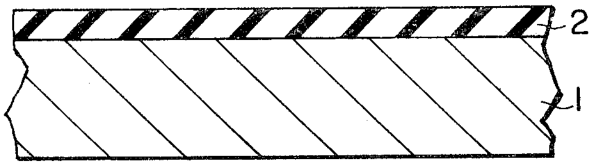
FIGS. 1*a* to 1*j* are sectional views illustrating an embodiment of the present invention according to the sequence of manufacturing steps.

As is shown in FIG. 1*a*, the surface of an N-type silicon substrate 1, having an impurity concentration of $1 \times 10^{15} - 1 \times 10^{16}$ atoms/cm$^3$ and being approximately 300$\mu$ thick is oxidized to form an oxide ($SiO_2$) film 2 to a thickness of about 2,000 –3,000 A.

Figure 1B:
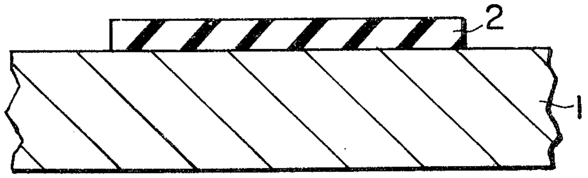

Next, as illustrated in FIG. 1*b*, a photoresist is applied selectively on the oxide film 2 and, using the photoesist as a mask, the oxide film 2 is partially etched and removed to thus expose parts of the surface of the substrate 1.

Figure 1C:
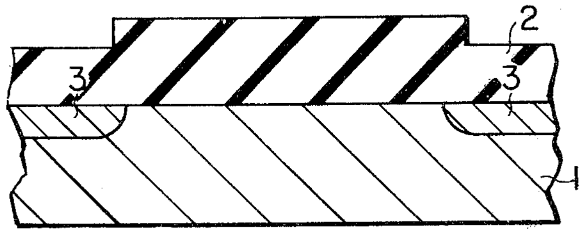

Next, an N-type impurity, such as phosphorus, is diffused through the exposed surface parts of the substrate 1, so that layers 3, of a relatively low impurity concentration ($2 \times 10^{16}$ to $6 \times 10^{16}$ atoms/cm$^3$) but having an impurity concentration higher than that of the substrate, are formed, as shown in FIG. 1*c*, for electrically stabilizing the substrate surface. The layers 3 function as channel stoppers or guard rings which prevent the surface of the substrate from having its conductivity type inverted. During this diffusion process, oxide layer 2 increases in thickness, as a further oxide layer is formed on the surface of the substrate. The depth of each layer 3 is approximately 5.5$\mu$.

Figure 1D:
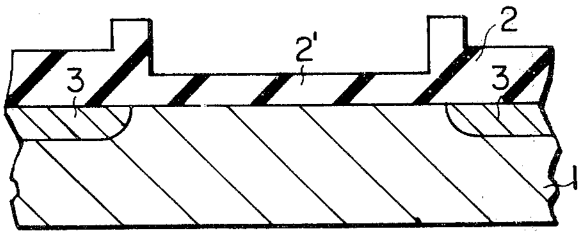

As is shown in FIG. 1*d*, the oxide film 2 lying between both the layers 3 is partially removed so that a thinner oxide film 2' of $SiO_2$ is provided on the exposed substrate surface. The thickness of the latter, thinner oxide film is approximately 1,000 A.

Figure 1E:
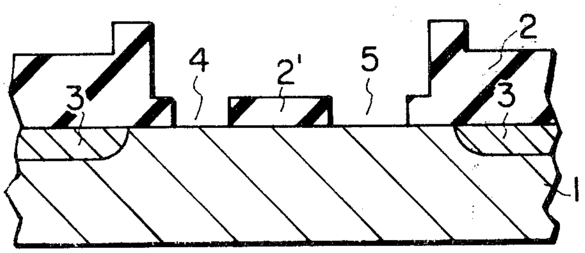

As is shown in FIG. 1*e*, in order to form a source region and a drain region during later steps, parts of the thin oxide film 2' are removed by photoetching. Thus, openings 4 and 5 are formed through which the source and the drain region are to be diffused.

Figure 1F:
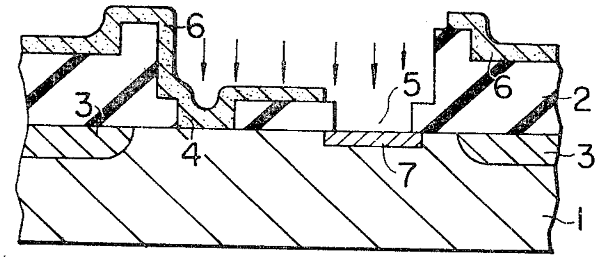

Next, as depicted in FIG. 1*f*, a photoresist film 6 of e.g., KTFR, produced by Kodak Corp. adapted to prevent ions from passing therethrough is applied on the entire surface of the oxide film 2 includikng on the opening 4 except in the opening 5. The photoresist film is about 1 $\mu$ thick. Then, through an ion implantation process, a P-type impurity, boron for example, is implanted into the exposed surface of the substrate 1 to form doped layer 7. Considering the diffusion depth, the quantity of implanted impurity ions is approximately $1.5 \times 10^{13}$ atoms/cm$^2$. In FIG. 1*f*, 7 designates a resultant P-type doped layer.

Figure 1G:
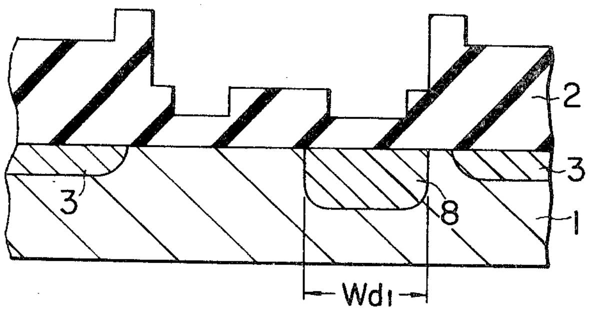

Next, the phororesist film 6 on the oxide film 2 is removed and, thereafter, the implanted boron is diffused from the P-type doped layer 7 into the interior of the substrate 1 by heating the substrate 1 in a dry $O_2$ atmosphere at 1,200°C for 16 hours, to form a P-type drain region 8 of a depth of 5 –10$\mu$ and a width Wd1 of about 50 $\mu$ as shown in FIG. 1*g*. During this diffusion process a further oxide layer is formed as depicted in the Figure. Regions 3 also diffuse further into the substrate at the same time as region 7 diffuses to form region 8, however, the diffusion of the guard rings is not critical to this embodiment. The surface impurity concentration of the P-type drain region 8 has a low value of $1 \times 10^{17}$ atoms/cm$^3$.

Figure 1H:
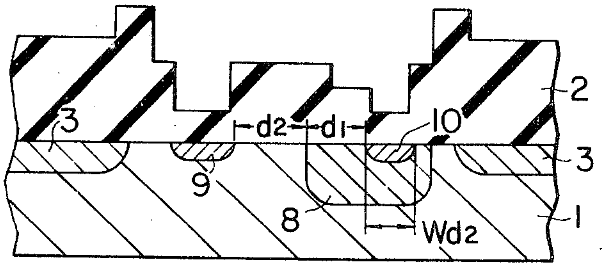

In order to uncover the opening 4 and the opening 5, the entire surface of the oxide films are exposed to an etchant to remove the thin oxide films formed during the diffusion step described in connection with FIG. 1*g*. The etching step need not employ a photoresist. Into the exposed surface parts of the substrate 1, a P-type imputity, such a boron, is shallowly diffused to a surface impurity concentration of $10^{19}$ to $10^{20}$ atoms/cm$^3$ by first depositing boron on the substrate at a temperature of 1045°C and then heating the substrate 1 at a temperature of 1,000°C in dry $O_2$ for 30 minutes and then wet $O_2$ for 60 minutes. Thus, a $P^+$ source region or P-type high-concentration region 9 is formed in the substrate portion corresponding to the opening 4, while a $P^+$ drain region or P-type high-concentration region 10 is formed in the P-type low-concentration drain region 8 as shown in FIG. 1*h*, with a further oxide layer, also. The depth and the width Wd2 of the drain region 10 are about 1.5 $\mu$ and 40$\mu$, respectively. The distance *d*1 between the edges of the regions 10 and 8 toward region 9 is about 8$\mu$, and the channel length *d*2 is about 6$\mu$.

Figure 1I:
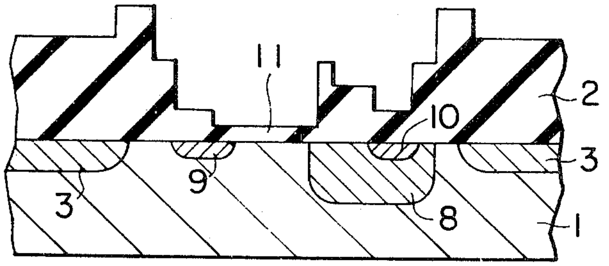

A portion of the oxide film 2, where a gqte electrode is to be formed, is removed, and as shown in FIG. 1*i*, on the exposed surface, a thin gate oxide film 11 ($SiO_2$) is formed to a thickness of approximately 1,000 –2,000 A by oxidizing the exposed silicon surface.

Figure 1J:
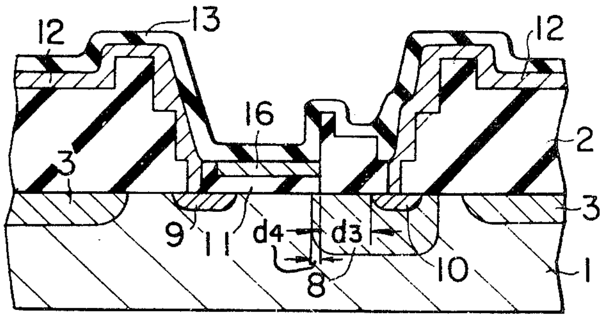

Finally, as shown in FIG. 1*j*, the oxide films on the source region 9 and the drain region 10 are partially removed to form contact holes. Aluminum is evaporated on the entire surface of the oxide films and in the holes by vacuum evaporation or electron beam evaporation. The evaporated aluminum layer is then selectively etched to form conductive layers 12 and gate electrode 16. Thereafter, a phosphosilicate glass layer 13 for protection of the conductive layers 12 is formed on conductive layers 12 and on the oxide films. In the MOS FET structure the gate electrode 16 is spaced from the heavily doped drain region 10 by a distance $d_3$ of 5 to 6$\mu$. In other words, the gate electrode 16 overlaps only the edge of the lightly doped drain region 8 by a distance $d_4$ of 2 to 3$\mu$.

Embodiment II

FIGS. 2*a* to 2*h* illustrate a second embodiment of the invention, in which the present invention is applied to an MOS type semiconductor device having a semiconductor gate of silicon.

The steps of the method of manufacturing the MOS type semiconductor device will be described below.

Figure 2A:
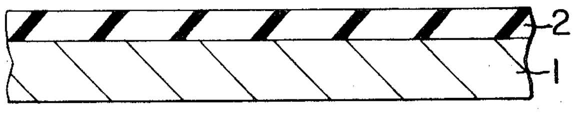
FIGS. 2*a* to 2*h* are sectional views illustrating another embodiment of the present invention.

As is shown in FIG. 2*a*, an N-type silicon substrate 1 having an impurity concentration of 6 $10^{14}$ to $1 \times 10^{15}$ atoms/cm$^3$ is thermally oxidized to form a silicon oxide film 2 with a thickness of 1.3 –1.5$\mu$ in the surface thereof.

Figure 2B:
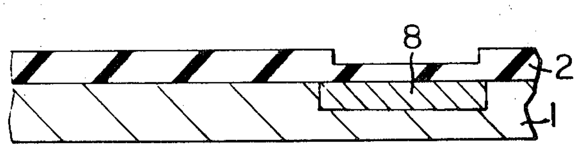

Then, a portion of the oxide film 2 is removed to partially expose the substrate 1. A P-type impurity, boron for example, is implanted into the exposed surface portion of the substrate 1 by ion implantation, with the surface impurity concentration of the implanted surface region being approximately $5 \times 10^{12}$ atoms/cm $^2$. The substrate 1 is thereafter subjected to heat-treatment to diffuse the impurity into the substrate, to thereby form a P-type drain region 8, as shown in FIG. 2*b*, to a depth of 5– 10$\mu$ and a comparatively low surface impurity concentration of about $1 \times 10^{15}$ atoms/cm$^3$. During the diffusion, a silicon oxide is formed on the region 8.

Figure 2C:
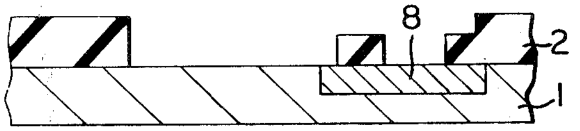
Figure 2D:
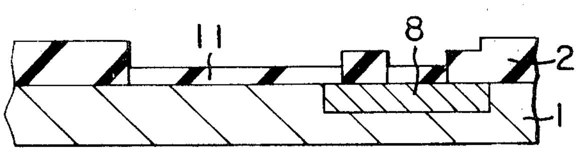

Then the oxide film on the substrate 1, and on the region 8, as shown in FIG. 2*b* are removed, as shown in FIG. 2*c*, at a part which a source region and a drain region are to be formed, Next, as shown in FIG. 2*d*, the exposed substrate surface is oxidized to form a gate oxide film 11 of silicon oxide. The thickness of the gate oxide film 11 is approximately 1,000 –2,000A.

Figure 2E:
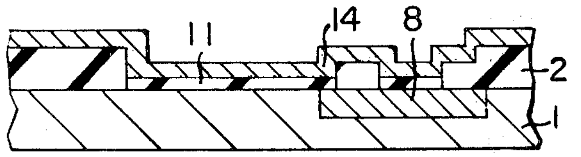

As a next step, a polycrystalline silicon layer 14 is formed on the oxide films 2 and 11 by vapor deposition to a thickness of approximately 4,000 –5,000 A, as shown in FIG. 2*e*.

Figure 2F:
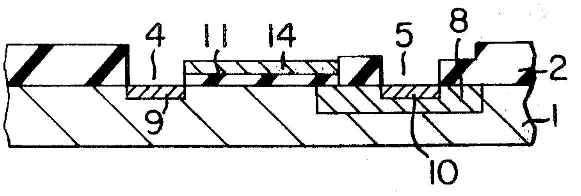

The polycrystalline silicon layer 14 is then partially removed so that a portion remains for forming a silicon gate electrode, as shown in FIG. 2*f*. Furthermore, portions of the gate oxide film 11 are removed to form openings 4 and 5, so that the surface parts of the substrate 1 for forming the source and drain regions are exposed. The opening 5 is so formed in the P-type drain region 8 as to be spaced from the silicon gate electrode 14. A p-type impurity, boron, for example, is diffused into the exposed part of the substrate 1 and the P-type low-concentration drain region 9, to form a $P^+$ source region (P-type high-concentration region) 9 and a $P^+$ drain region (P-type high concentration region) 10. The P-type high-concentration regions 9 and 10 have a surface impurity concentration of $10^{19}$ to $10^{20}$ atoms/$cm^3$ and a thickness of 0.7 –1.0 $\mu$. The impurity is also diffused into the silicon gate layer 14 so that the layer 14 has P-type conductivity.

Figure 2G:
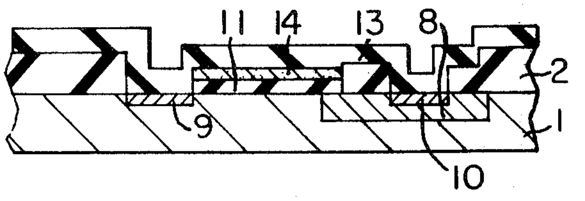

Next, as shown in FIG. 2*g*, a first phospho-silicate glass layer 13 is formed on the entire surface of the oxide films and silicon layer 11, as well as the openings 4 and 5.

Figure 2H:
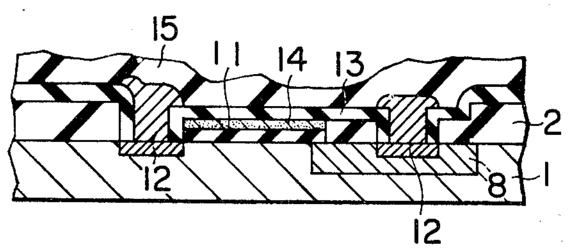

Then, as shown in FIG. 2*h*, openings are provided at parts of the glass layer 13 overlying the P-type high-concentration regions 9 and 10, and aluminum is evaporated on the glass layer 11 as well as in the openings. The aluminum layer thus formed is selectively removed to form conductive layers 12 connected to the source and drain regions 9 and 10 and the gate 14. Thereafter, a second phosphosilicate glass layer 15 is formed on the entire surface of the glass layer 13 and the conductive layers 12 except for bonding pads to which lead out connectors are to be connected.

In accordance with the present invention, as described above, the objects can be accomplished and the advantageous effects can be brought forth for the following reasons.

Figures 3A, 3B:
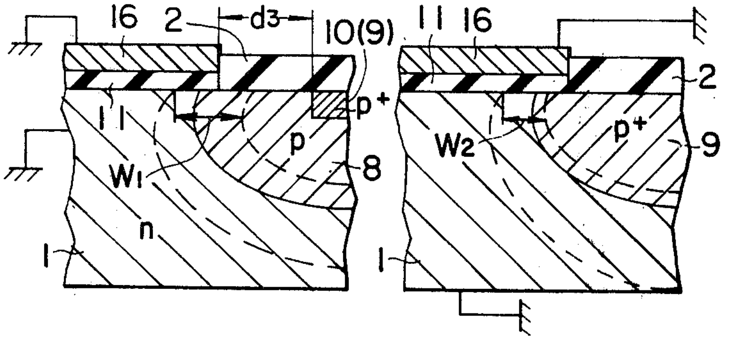
FIG. 3a FIG. 3b Prior Art
FIGS. 3*a* and 3*b* are sectional views for comparing the widths of depletion layers in a MIS type semiconductor device according to the present invention and a prior art MIS type semiconductor device.

With reference to FIGS. 3*a* and 3*b*, comparisons will now be made between the width $W_1$ of a depletion layer extending from a PN junction contiguous to the low-concentration region 8 as in the present invention (FIG. 3*a*) and the width $W_2$ of a depletion layer extending from a PN junction in the prior art (FIG. 3*b*).

In the present invention, since the impurity concentration in the P-type region 8 is low, the depletion layer can extend deeply into the P-type region 8, so that the electric field concentration is not very influential, even beneath the region overlapping gate electrode 16. In contrast, in the prior art, since the impurity concentration in the P-type region 9 is high, the depletion layer can not extend deeply into the P-type region 9, even with a high electric field concentration. As a result, the width $W_1$ of the depletion layer at the P-N junction surface beneath the gate electrode 16 of the MIS type semiconductor device of the present invention becomes larger than the width $W_2$ of the depletion layer in the prior art MIS type semiconductor device. Thus, the MIS type semiconductor device of the present invention having a low-concentration P-N junction can have its operating voltage increased with respect to that of the prior art. For example, an operating voltage of 30 V in the prior art device can be raised to 80 – 100 V in the present invention.

Furthermore, since the edge of the gate electrode 16 formed on the thin gate insulator film portion is located over the depletion region, in which potential changes gradually static breakdown of the gate insulator can be avoided, even for a high operating voltage.

Also, because of a substantially continuous PN junction between the substrate and the low impurity concentration source or drain regions, an adverse concentration of the electric field is avoided.

Figure 4:
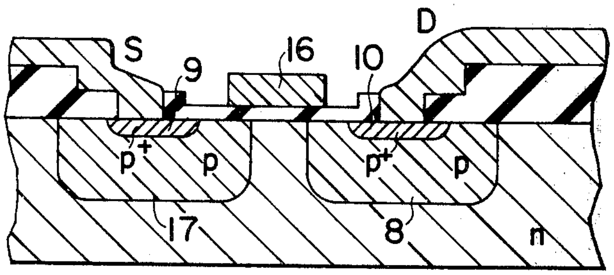
FIG. 4 is a sectional view illustrating the final manufacturing step of still another embodiment of the present invention.

In addition to the features of the foregoing embodiments, the present invention has the following characteristics:

1. Although the above embodiments are for P-channel devices, the present invention is similarly applicable to N-channel devices. In the latter case, the silicon substrate 1 is P-type. The drain region consists of an N-type low-concentratioln region, which is partially formed with an $N^+$-type high-concentration region. The cource region is of $N^+$--type;

2. In the above embodiments, the drain region is formed in such a way that a P-type low-concentration region 8 is first formed, and a P-type high-concentration region 10 is thereafter formed at a portion of the region 8. An alternative arrangement is illustrated in FIG. 4. As shown therein, when the P-type low-concentration drain region 8 is formed, a P-type low-concentration source region 17 is simultaneously formed. Thereafter, the P-type high-concentration region 9 is formed at a portion of the region 17. Thus, the source region is completed. Also, in this case, an MIS type semiconductor device having a high operating voltage is produced;

3. The source region and drain region may also be formed by only diffusion techniques without jointly using ion impantation;

4. Other metallic materials, such as molybdenum, may be used in place of aluminum or silicon for the gate electrode;

5. Other crystal semiconductors, such as intermetallic compound semiconductors (e.g., GaAs)and germanium may be employed in place of silicon for the starting semiconductor substrate. In such cases, inculating films ($SiO_2$, $Al_2O_3$, $Si_3N_4$, etc.) should be deposited on the substrate, since stable insulating films can not be obtained by oxidizing the intermetallic compound semiconductor and germanium.

Of course, the method of the present invention can be applied to all types of semiconductor devices of MIS construction and while We have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim:

1. A method of manufacturing an insulated gate type field effect transistor, comprising the steps of:

a. forming a first insulating film on a semiconductor substrate;

b. forming, in said first insulating film, a first hole extending to the surface of the substrate;

c. introducing a conductivity type impurity determining which is different from that of the substrate, through said first hole into said substrate to form a first region of a relatively low impurity concentration;

d. forming a second insulating film in said hole;

e. forming, in said first and second insulating films, a second hole exposing a surface portion of said first region, and a third hole exposing a surface portion of said substrate, spaced apart from said first region;

f. introducing an impurity, determining the same conductivity type as that of said first region, through said second and third holes to form respective second and third regions having a relatively high impurity concentration;

g. removing part of the insulating films to expose a surface part of the substrate between said first and third regions and an edge part of the first region;

h. forming a third insulating film on the exposed surfaces of said substrate and said first region; and i. forming an electrode on said third insulating film to extend over the edge of said first region but not extending over said second region.

2. A method according to claim 1, wherein said step (a) includes the step of forming a composite film of an oxide film having an opening the size of said first hole and an ion implantation preventing mask on said oxide film having an opening larger than said first hole, and wherein said step (c) includes the step of implanting ions through said first hole to form an ion implanted region and then diffusing the impurities implanted into said ion implanted region further into said substrate to form said first region.

3. A method according to claim 2, wherein said step (f) includes the step of simultaneously shallowly diffusing impurities to form said second and third regions.

4. A method according to claim 1, further including the steps of forming an additional hole in said first insulating film extending to the surface of said substrate, forming a further region of a relatively low impurity concentration of a conductivity type opposite that of said substrate in said substrate, by introducing an impurity through said additional hole, and wherein said third region is formed in said further region, and wherein the electrode formed in step (i) extends over the edge of said further region but does not extend over said third region.

5. A method according to claim 4, further comprising the steps of forming respective electrode contacts in said second and third regions.

6. A method manufacturing an insulated gate type field effect transistor comprising the steps of:

a. forming a first insulating film on a semiconductor substrate;

b. forming, in said first insulating film, a first hole extending to the surface of the substrate;

c. introducing an impurity determining a conductivity type, which is different from that of the substrate, through said first hole into the substrate to form a first region of a relatively low impurity concentration;

d. forming a second insulating film on said first region;

e. forming a second and a third hole in said first and second insulating films, so that said second hole exposes part of said first region and said third hole exposes an edge part of the first region, spaced from said second region and a surface part of the substrate in the vicinity of the exposed edge part of the first region;

f. forming a third insulating film on the exposed surfaces of said substrate and said first region;

g. forming a silicon layer on at least part of said third insulating film to cover the edge of said first region and a surface part of the substrate adjacent to said first region;

h. forming, in said insulating films, a fourth hole exposing surface part of said first region, and a fifth hole exposing a surface part of the substrate spaced from said first region, an edge of said fifth hole being registered with an edge of the silicon layer; and i. introducing an impurity determining the same conductivity type as that of said first region, through said fourth and fifth holes to form a second and a third region of a relatively high impurity concentration.

7. A method of manufacturing an insulated gate type field effect transistor, comprising the steps of:

a. forming an insulating film on a semiconductor substrate;

b. forming, in said insulating film, a first and a second hole exposing part of the semiconductor substrate;

c. doping the semiconductor surface exposed by said first hole with an impurity determining a conductivity type, different from that of the substrate;

d. diffusing the doped impurity into the substrate to form a first region of a relatively low impurity concentration, and e. diffusing an impurity determining the same conductivity type as that of the first region into said first region and said substrate through said first and second holes, to form a second and a third region of relatively high impurity concentration.

8. A method of manufacturing a semiconductor device comprising the steps of:

a. providing a semiconductor substrate of a first conductivity type;

b. selectively introducing an impurity of a second conductivity type, opposite said first conductivity type, into said substrate, to form at least one first semiconductor region of said second conductivity type and having a relatively low impurity concentration therein;

c. selectively introducing a second conductivity type impurity into a portion of said at least one first semiconductor region but spaced from the edge thereof, to form at least one second semiconductor region of said second conductivity type and having a relatively high impurity concentration;

d. selectively forming an insulating film on a prescribed surface portion of said substrate adjacent said at least one first semiconductor region and overlapping the edge of said first semiconductor region and said substrate but not the edge of said second semiconductor region; and e. forming an electrode layer on said insulating film so that said electrode layer overlaps the edge of said first semiconductor region and said substrate but not the edge of said second semiconductor region.

9. A method according to claim 8, wherein step (b) comprises the formation of a pair of first semiconductor regions spaced apart from one another by said prescribed surface portion of said substrate therebetween.

10. A method according to claim 8, wherein said step (c) comprises the step of introducing said second conductivity type impurity into a further surface portion of said substrate spaced from said first region by said prescribed surface portion thereof, to form a third semiconductor region of said second conductivity type and a relatively high impurity concentration.

11. A method according to claim 10, wherein steps (d) and (e) include forming said insulating film and said electrode layer to partially overlap said third semiconductor region.

* * * * *